United States Patent
Dimmler et al.

(10) Patent No.: US 6,989,697 B2
(45) Date of Patent: Jan. 24, 2006

(54) NON-QUASISTATIC PHASE LOCK LOOP FREQUENCY DIVIDER CIRCUIT

(75) Inventors: Klaus Dimmler, Colorado Springs, CO (US); Robert R. Rotzoll, Chipita Park, CO (US)

(73) Assignee: OrganicID, Inc., Colorado Springs, CO (US)

( * ) Notice: Subject to any disclaimer, the term of this patent is extended or adjusted under 35 U.S.C. 154(b) by 0 days.

(21) Appl. No.: 11/030,345

(22) Filed: Jan. 6, 2005

(65) Prior Publication Data
US 2005/0156641 A1 Jul. 21, 2005

Related U.S. Application Data

(60) Provisional application No. 60/536,603, filed on Jan. 15, 2004, provisional application No. 60/539,611, filed on Jan. 27, 2004, provisional application No. 60/539,612, filed on Jan. 27, 2004, provisional application No. 60/539,610, filed on Jan. 27, 2004.

(51) Int. Cl.
H03L 7/06 (2006.01)
(52) U.S. Cl. .................................. 327/156; 327/163
(58) Field of Classification Search ............. 327/154, 327/155, 156, 158, 161, 162, 163, 116; 331/17, 331/25; 375/375, 376; 377/47, 48
See application file for complete search history.

(56) References Cited

U.S. PATENT DOCUMENTS

| | | | |
|---|---|---|---|
| 4,186,281 A * | 1/1980 | Kasuga et al. | 369/88 |
| 4,734,655 A * | 3/1988 | Kawai | 331/25 |
| 6,351,191 B1 * | 2/2002 | Nair et al. | 331/57 |

(Continued)

FOREIGN PATENT DOCUMENTS

JP 2002319007 10/2002

OTHER PUBLICATIONS

Tsividis, Yannis, Operation and Modeling of the MOS Transistor, McGraw-Hill, 1987, pp. 275-286.

(Continued)

*Primary Examiner*—Linh My Nguyen
(74) *Attorney, Agent, or Firm*—Peter J. Meza; Hogan & Hartson LLP

(57) ABSTRACT

A non-quasistatic MOS frequency divider circuit uses a phase lock loop configuration including an antenna coil to induce a differential input signal, an antenna resonating capacitor, a rectifier, a voltage controlled ring oscillator, a phase detector and a loop filter. All transistors used are organic MOS devices of PMOS, NMOS or both PMOS and NMOS varieties. The voltage-controlled oscillator includes a multiple delay stage ring oscillator. The phase detector includes transistors connected as sampling switches to sample the individual oscillator stage voltages into the loop filter. The sampling transistors have gates connected to the coil. The loop filter provides a substantially direct current to a loop amplifier and then to the voltage controlled oscillator delay control input. This configuration results in the voltage controlled oscillator frequency being synchronous to—and at a sub-multiple of the antenna signal frequency. The sampling transistor gates are all connected to the coil and thereby become part of the capacitance of the radio frequency parallel resonant network. The transistor gates are then efficiently switched at the rate of the radio frequency signal with no delay relative to the coil voltage. Operation of the phase detector organic transistors is based on non-quasistatic behavior of the transistor. Non-quasistatic operation results in phase detection at a frequency much higher than the quasistatic limit of transistor unity gain bandwidth.

33 Claims, 15 Drawing Sheets

U.S. PATENT DOCUMENTS 6,426,680 B1 * 7/2002 Duncan et al. ............... 331/34
6,642,878 B2 * 11/2003 Libove et al. .............. 341/144
6,806,124 B2 * 10/2004 Klauk et al. ................ 438/149
6,848,620 B2 * 2/2005 Nakane et al. .............. 235/492

OTHER PUBLICATIONS

Burns, J.R., Large-signal transit-time effects in the MOS transistor, RCA Review, vol. 15, Mar. 1969, pp. 15-35.

* cited by examiner

PHASE LOCK LOOP – LOCK MODE

NON-QUASISTATIC PHASE LOCK LOOP FREQUENCY DIVIDER CIRCUIT

The present application is related to and claims priority from U.S. Provisional Application Ser. Nos. 60/536,603, filed Jan. 15, 2004, entitled "Circuitry for the Design of RFID Tags in Polymer Electronic Processes", 60/539,611, filed Jan. 27, 2004, entitled, "RFID Organic Process Methods", 60/539,612, filed Jan. 27, 2004, entitled, "RFID Organic Circuit Designs", and 60/539,610, filed Jan. 27, 2004, entitled, "RFID Organic Flexographic Printline Method". The disclosures of all four provisional applications are herein specifically incorporated in their entirety by this reference.

BACKGROUND OF THE INVENTION

1. Field of the Invention

The invention relates to organic transistors, and, more particularly, to a phase lock loop circuit and frequency division method suitable for use given the performance constraints of organic transistors.

2. Description of the Related Art

Organic MOS transistors are similar to silicon metal-oxide-semiconductor transistors in operation. The major difference in construction is that the organic MOS transistor utilizes a thin layer of a semiconducting organic polymer film to act as the semiconductor of the device, as opposed to a silicon layer as used in the more typical in-organic silicon MOS device.

Referring now to FIG. 1, a cross-sectional diagram of a top-gate bottom contact organic MOS transistor 100 is shown. A metallic region 122 is deposited on an insulating substrate 112 forming the gate 122 of the organic MOS device 100. A thin dielectric region 120 is placed on top of gate region 122 to electrically isolate it from other layers and to act as the MOS gate insulator. Metallic conductors 118 and 116 are formed on the dielectric region 120 above the gate region 122 such that there is a gap 124 between conductors 116 and 118 overlapping gate metal 122. The gap 124 is known as the channel region of transistor 100. A thin film of organic semiconducting material 114 is deposited on dielectric region 120 and over at least a portion of metallic conductors 116 and 118. A voltage applied between the gate 122 and the source 118 modifies the resistance of the organic semiconductor film 114 in gap region 124 in the vicinity of the interface between semiconductor region 124 and dielectric 120. This is defined as the "field effect". When another voltage is applied between the source 118 and the drain 116, a current flows between the drain and source with a value dependent on both the gate-to-source and the drain-to-source voltages.

An organic transistor 200 can also be constructed as a top-gate top contact structure as shown in FIG. 2. Conductor layer 222 is deposited and patterned on substrate 212. A dielectric layer 220 is deposited on conductor layer 222. A thin film of semiconductor material 214 is deposited on top of dielectric layer 220. A conductive film is deposited and patterned on top of organic semiconductor 2164 to form conductive source and drain regions 216 and 218, such that there is a gap 224 that overlaps the underlying gate metal layer 224. The gap 224 is known as the channel region of transistor 200. Through a field effect, a voltage is applied between gate conductor 222 and source 218 that modifies the resistance of the organic semiconductor 214 in the gap region 224 in the vicinity of the interface between the semiconductor region 214 and the dielectric 220. When another voltage is applied between source 218 and drain 216, a current flows between the drain and the source with a value dependence on both the gate-to-source and the drain-to-source voltages.

Organic transistor 300 can also be constructed as a top gate structure as shown in FIG. 3. A conductive film is deposited and patterned on an insulating substrate 312 to form conductive regions 318 and 316. One of these conductive regions is known as the source 318, and the other as the drain 316. The gap 324 between source 318 and drain 316 is known as the channel region of transistor 300. A thin organic semiconductor layer 326 is deposited on top of these conductive regions such that the entire gap 324 and at least a portion of conductive regions source 318 and drain 316 are covered. A dielectric layer 320 is deposited on top of semiconductor layer 326. A conductive layer 322 is deposited and patterned such that at the underlying gap 324 and at least a portion of the source 316 and the drain 316 are covered. A field effect will cause the resistance of the organic semiconductor 326 inside the gap 324 in the vicinity of the interface between the semiconductor 326 and the dielectric 320 to decrease as a voltage is applied between the gate 322 and the source 318. When another voltage is applied between the source 318 and the drain 316, current flows between the source 318 and the drain 316. The value of the current depends on the voltage between gate 322 and the source 318.

In all of the structures shown in FIGS. 1–3, all layers may be patterned as long as the gate conductor overlaps the channel region gap and at least a portion of the source and drain, and organic semiconductor and dielectric are placed so that the gate conductor and the source/drain conductor are electrically isolated.

Organic semiconductor materials are often classified as polymeric, low molecular weight, or hybrid. Pentacene, hexithiphene, TPD, and PBD are examples of low weight molecules. Polythiophene, parathenylene vinylene, and polyphenylene ethylene are examples of polymeric semiconductors. Polyvinyl carbazole is an example of a hybrid matrial. These materials are not classified as insulators or conductors. Organic semiconductors behave in a manner that can be described in terms analogous to the band theory in inorganic semiconductors. However, the actual mechanics giving rise to charge carriers in organic semiconductors are substantially different from inorganic semiconductors. In inorganic semiconductors, such as silicon, carriers are generated by introducing atoms of different valencies into a host crystal lattice, the quantity of which is described by the number of carriers that are injected into the conduction band, and the motion of which can be described by a wave vector k. In organic semiconductors, carriers are generated in certain materials by the hybridization of carbon molecules in which weakly bonded electrons, called π electrons, become delocalized and travel relatively far distances from the atom which originally gave rise to that electron. This effect is particularly noted in materials comprising of conjugated molecules or benzene ring structures. Because of the delocalization, these π electrons can be loosely described as being in a conduction band. This mechanism gives rise to a low charge mobility, a measure describing the speed with which these carriers can move through the semiconductor, resulting in dramatically lower current characteristics of organic semiconductors in comparison to inorganic semiconductors.

Besides a lower mobility, the chemistry of carrier generation gives rise to another key difference between the operation of an organic MOS transistor and inorganic semiconductor. In the typical operation of an inorganic semiconductor, the resistance of the channel region is modified by an "inversion layer" consisting of the charge carriers made up of the type of charge that exists as a minority in the semiconductor. The silicon bulk is doped with the opposite type of carrier as compared to that used for conduction. For example, a p-type inorganic semiconductor built with an n-type semiconductor, but used p-type carriers, also called holes, to conduct current between the source and drain. In the typical operation of an organic semiconductor, however, the resistance of the channel region is modified by an "accumulation layer" consisting of charge carriers made up of the type of charge that exists as a majority in the semiconductor. For example, a PMOS organic transistor uses a P-type semiconductor and p-carriers, or holes, to generate the current in typical operation.

To fully understand the operation of a typical organic transistor, "non-quasistatic MOS transistor operation" must be explained. MOS transistors, both organic and inorganic, are normally assumed to allow immediate current flow between the source and drain of the device upon the application of a gate-to-source voltage. This is called the "quasistatic" assumption and allows for the development of a very simple transient-effect model of the MOS device. This assumption is only true when the transistor is operated at a frequency of operation substantially lower than the maximum frequency response of the charge carrier. Whereas this is true for most typical applications using inorganic semiconductors, this is not true for organic transistors operating at high speeds. When there is a significant delay between the application of gate-to-source voltage and the motion of the charge carriers giving rise to current the transient behavior of those charge carriers must be taken into account.

This delay has two components: a period with no current flow and a period of increasing current flow until a constant, stable current flow forms. This is shown in FIG. 4. The timing diagram of FIG. 4 includes a gate voltage pulse 424, a quasistatic drain current pulse 428, as is found in a conventional silicon MOS transistor, and a "non-quasistatic" drain current pulse 426 as is found in an organic transistor operating at high speed. Referring to voltage pulse 426, beyond the point where the current no longer increases, the device has quasi-static ("QS") behavior. The delay region models non-quasistatic ("NQS") behavior. This region is normally ignored because this delay is typically on the order of picoseconds for silicon MOS circuits that operate with pulse periods of one hundred or more picoseconds. Non-quasistatic behavior can be ignored in this case because the NQS delay is inconsequential relative to the signal periods of interest in a typical silicon MOS circuit. In organic transistors, this delay is on the order of ten nanoseconds, thereby requiring accounting of this effect when the transistor is operated in the hundreds of kilohertz and above range. The unity gain frequency of a transistor is defined as the frequency of operation at which the transistor is has an output voltage equal to the input voltage. When the transistor is operated below this frequency, the output voltage will be larger than the input voltage. When the transistor is operated above this frequency, the gain of the transistor is below unity meaning that the output voltage is less than the input voltage. Unity gain is always well below the frequency at which non-quasistatic behavior becomes an appreciable and measurable effect.

Though organic transistors have much lower performance than inorganic transistors, the materials and processing techniques to produce organic transistors cost significantly less those used to produce inorganic transistors. Therefore, organic transistor technology has application where low cost is desired and low performance is acceptable. Therefore, as the effective performance of an organic transistor is increased, the number of applications for organic transistor technology also increase. An example of this type of application are Radio Frequency Identification (RFTD) tags. Though RFID tags can be produced that operate at any frequency, it is desirable to produce RFID tag using frequency ranges that are used in typical applications. One such typical frequency for RFID tags is 13.56 Mhz, a frequency that is well above the unity gain frequency of organic transistors, and in the range where non-quasi-static behavior needs to be taken into account.

What is desired, therefore, is a practical circuit, such as a phase lock loop, that uses organic transistors operating at frequencies far above the unity gain bandwidth where non-quasi-static behavior needs to be taken into account.

SUMMARY OF THE INVENTION

According to an embodiment of the present invention, a non-quasistatic MOS frequency divider circuit uses a phase lock loop configuration comprising an antenna coil to induce a differential input signal, an antenna resonating capacitor, a rectifier, a voltage controlled ring oscillator, a phase detector and a loop filter. The voltage-controlled oscillator is to operate at frequencies below that of the supplied antenna voltage and comprises a series of delay stages with an inverting feedback path. The number of stages in the ring oscillator establish the frequency division ratio. The output of the ring oscillator drives a phase detector comprising one or two organic MOS transistors for each stage of the ring oscillator. The transistors act as sampling switches to sample the output of each stage for use by the loop filter. The signal from the antenna drives a rectifier to develop direct current power and results in the antenna terminal voltages operating each with an average value above the rectifier output negative voltage and below the rectifier output positive voltage. The differential input signal from the antenna is connected to the phase detector transistor gates to control the phase detector sampling operations. Capacitive loading effects of the phase detector transistor gates are absorbed in the capacitance of the antenna tuned-circuit resulting in a large signal voltage at the gates. The gates are operated at frequencies in excess of their associated transistor transition frequency forcing the transistor into the non-quasi-static mode. Each transistor passes a small pulse of current related to the sampled level from the associated delay stage of the ring oscillator. The current pulse is sampled by the loop filter network and is converted into a substantially direct current signal. The signal level is increased by the loop amplifier and returned to the control voltage input of the voltage-controlled oscillator. The control voltage input modifies the delay of each delay stage of the oscillator and thereby modifies the frequency of oscillation. This completes the feedback connection of the phase lock loop. Perturbations in the voltage-controlled oscillator frequency or phase result in a shift of the average output voltage of the loop filter such that the frequency error between the divided antenna signal and voltage-controlled oscillator is corrected. The loop is configured to cause the voltage controlled oscillator to acquire and maintain a frequency that is a synchronous sub-multiple of the antenna signal frequency defined by the number of delay stages in the oscillator. The circuit of the present invention operates as a frequency divider because the phase detector transistors can be switched by the antenna circuit within a channel formation time of less than the 36.9 nanoseconds determined by a half-cycle at the 13.56 MHz radio frequency on the coil.

DESCRIPTION OF THE DRAWINGS

The present invention is illustrated by way of example and not by limitation in the accompanying figures in which like reference numerals indicate similar elements and in which.

DETAILED DESCRIPTION

Figure 1:
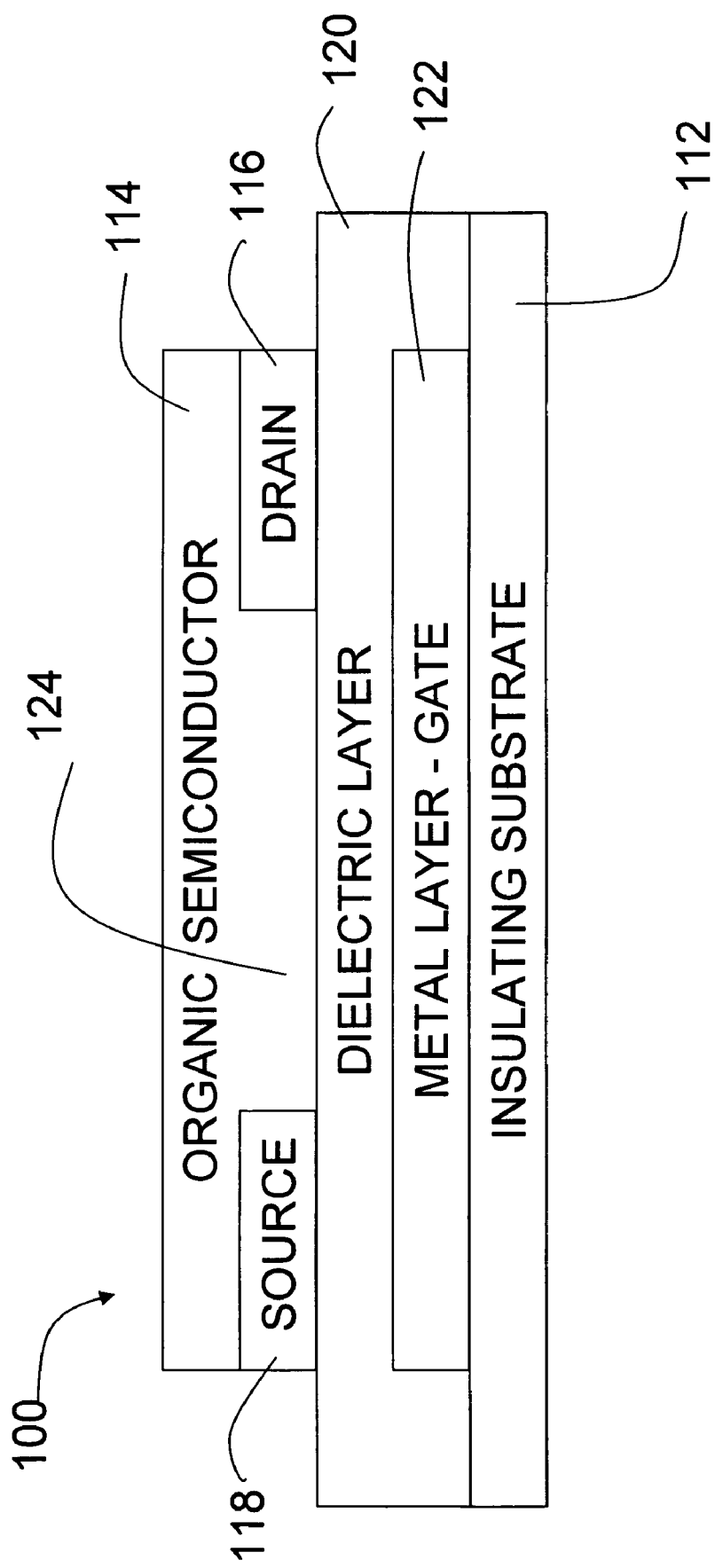
FIGS. 1–3 are a cross-sectional views of an organic MOS transistors including an insulating substrate, organic polymer film, dielectric layer, and conductive gate, according to the prior art.
Figure 2:
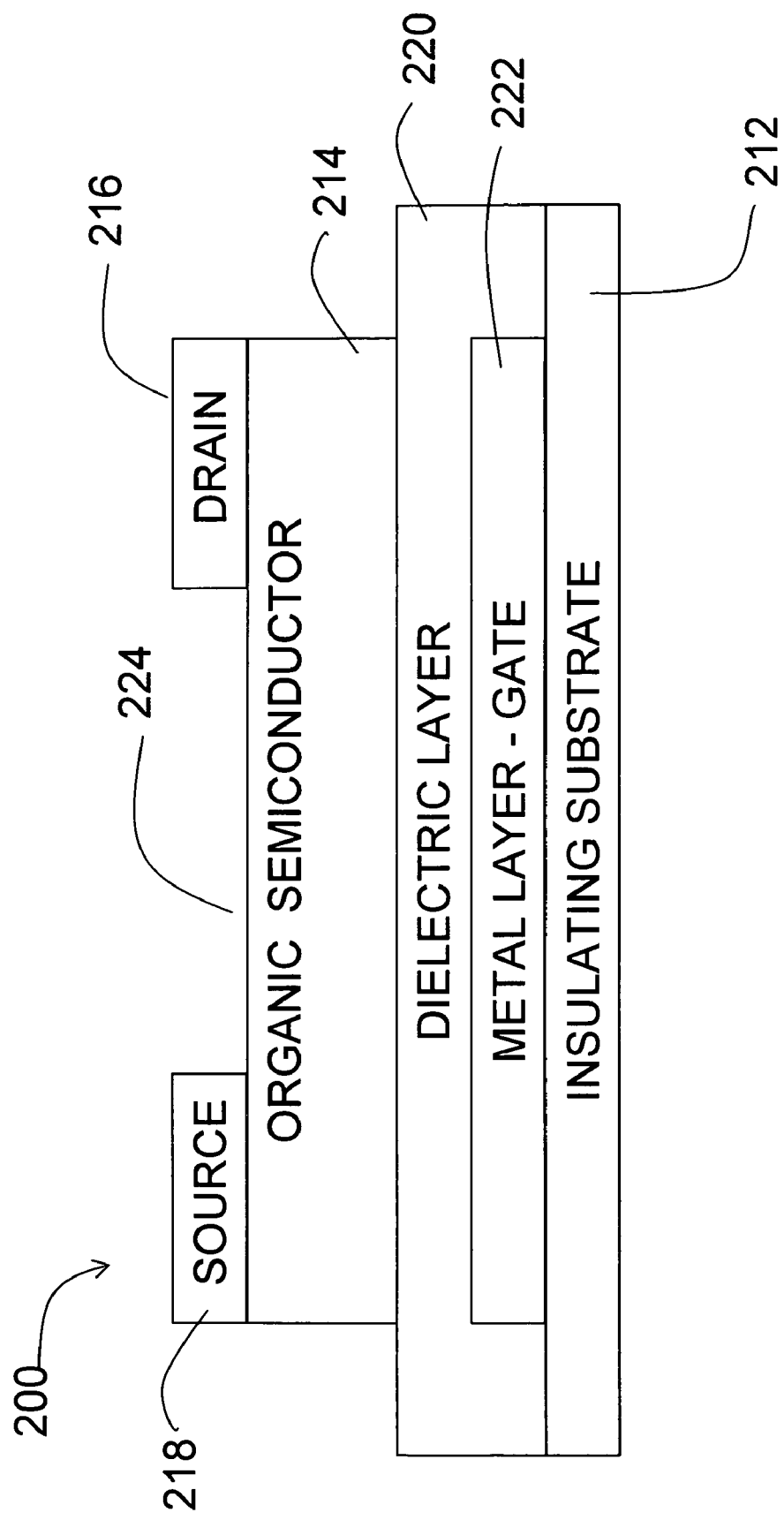
Figure 3:
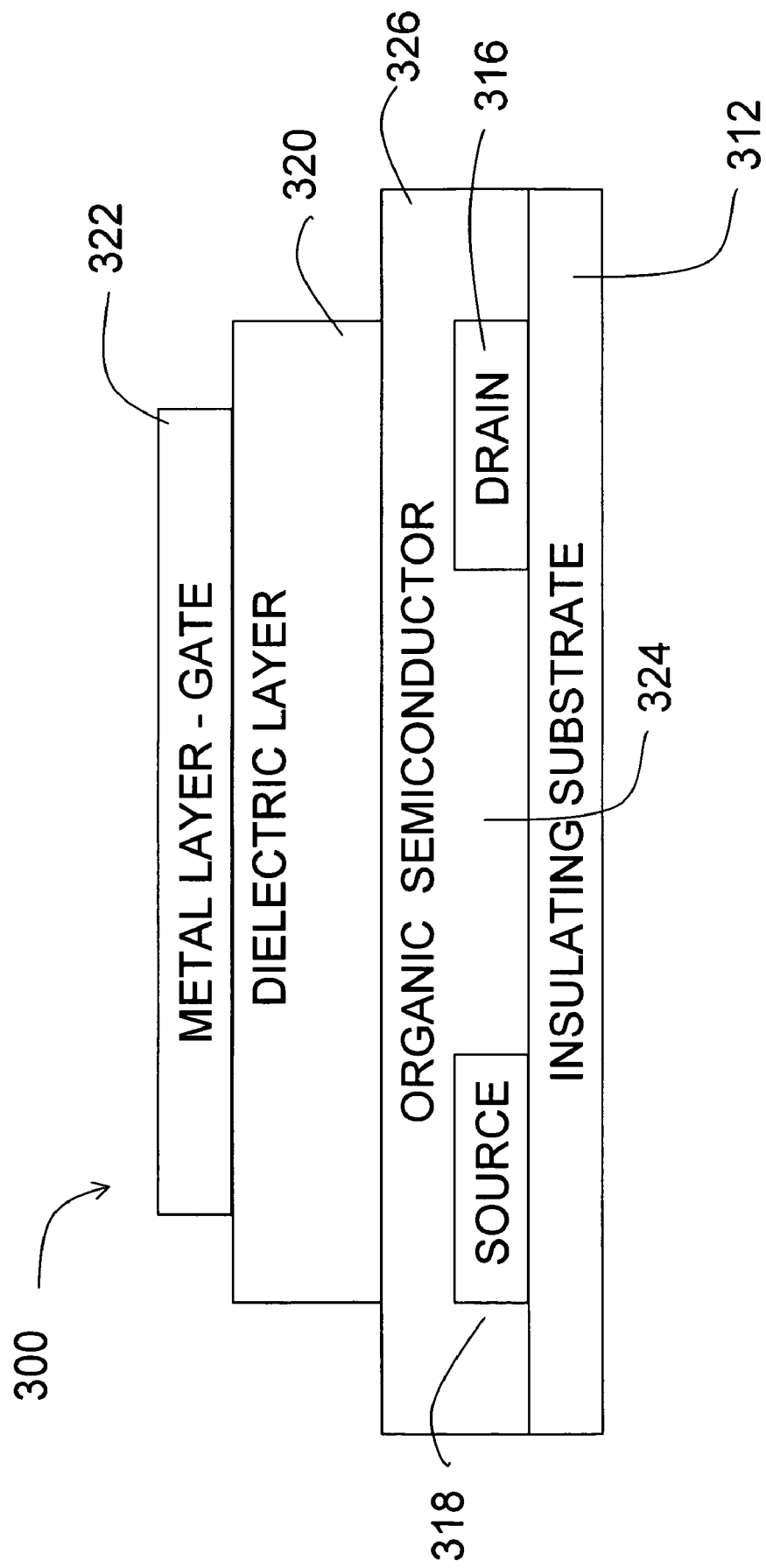
Figure 4:
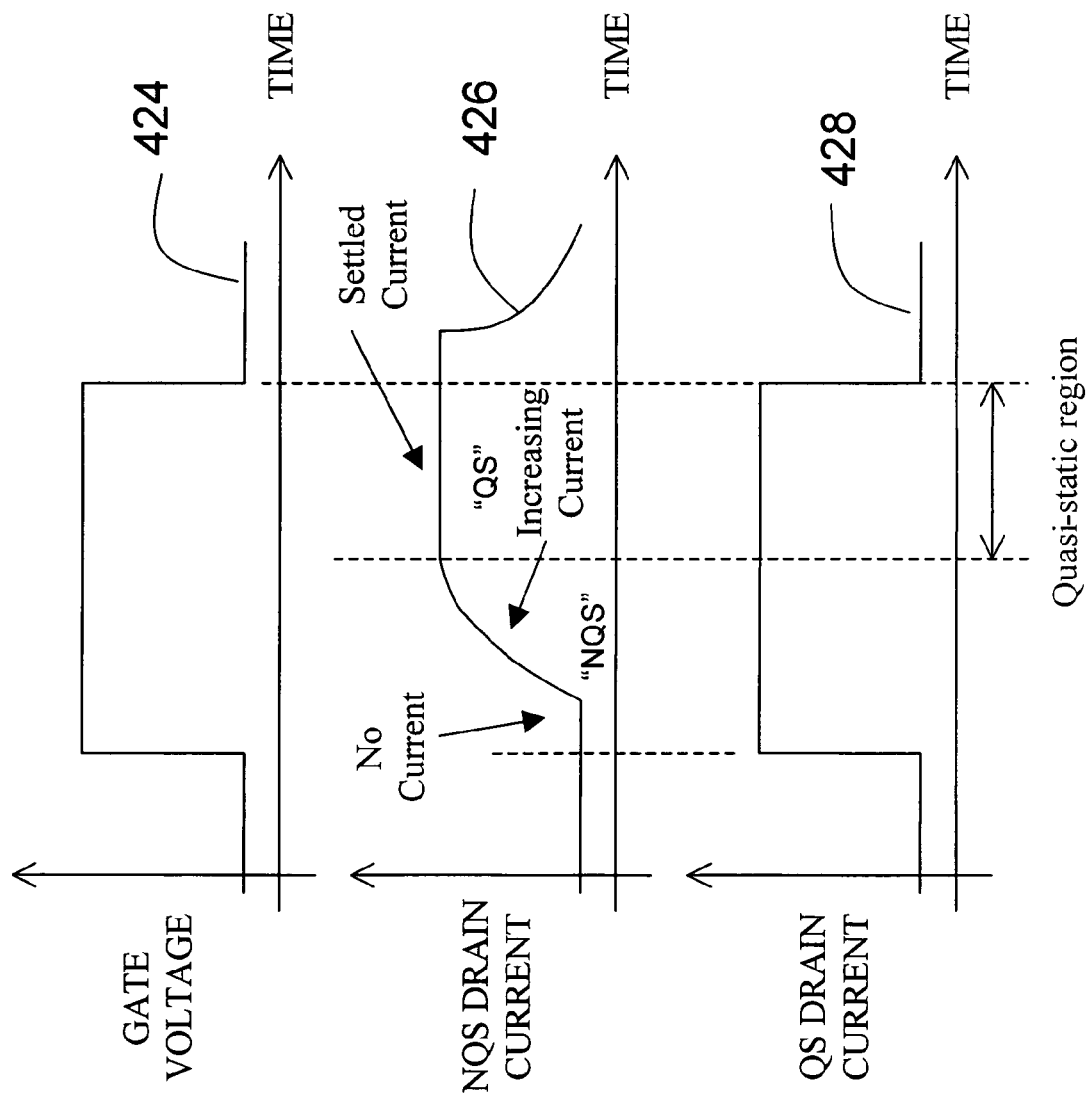
FIG. 4 is a timing diagram showing a gate voltage pulse, as well as accompanying drain current responses for a quasistatic mode of operation as is found in an ideal silicon MOS transistor, and for a non-quasistatic mode of operation as is found in a typical organic MOS transistor.
Figure 5:
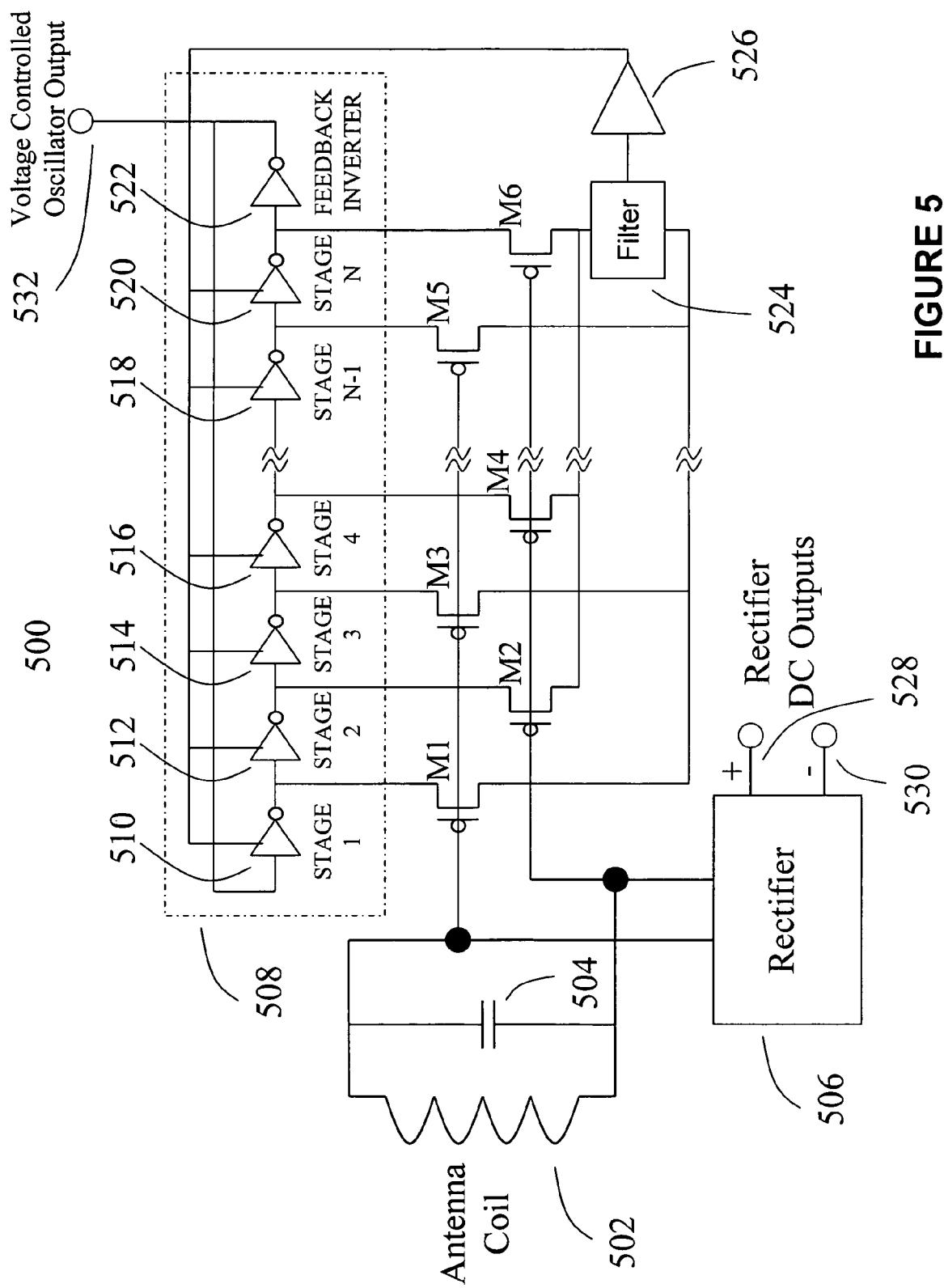
FIG. 5 is a circuit diagram of a phase lock loop frequency divider circuit according to a first embodiment of the invention including an antenna coil, an antenna resonating capacitor, a PMOS organic transistor phase detector circuit, a voltage-controlled oscillator, a loop filter and a loop amplifier.

Referring now to FIG. 5 a phase lock loop frequency divider 500 according to a first embodiment of the present invention includes first and second input terminals for receiving a differential input signal from antenna coil 502 and an output terminal 532 for providing a synchronous output signal, which is generated by voltage controlled oscillator 508. A capacitor 504 is coupled between the first and second input terminals. The voltage controlled oscillator 508 comprises delay stages 510, 512, 514, 516, 518 and 520, as well as feedback inverter stage 522. The inverting stage 522 may be included as part of stage 520 depending on the implementation of stage 520. The delay stages include an delay control input fed by loop amplifier 526. The voltage controlled oscillator 508 implements a ring oscillator. Each delay stage in the voltage-controlled oscillator provides time delay and phase inversion of the pulse signal passing through the oscillator loop. The feedback inverter 522 guarantees that the total feedback loop within voltage-controlled oscillator 508 has an odd number of inversions, a necessary condition for oscillation of a ring oscillator. The individual stage outputs are connected via phase detector organic PMOS sampling transistors M1, M2, M3, M4, M5 and M6 to the loop filter 524 through the source connection of the transistors. The gates of transistors M1, M3 and M5 are connected to the first output of antenna coil 502. The gates of transistors M2, M4 and M6 are connected to the second output of antenna coil 502. The resulting gate interconnection results in alternate voltage controlled oscillator delay stage outputs having sampling transistors connected to the same antenna coil 502 terminal. The drain connection of M1, M3 and M5 are connected to the first terminal of loop filter 524. The drain connection of M2, M4 and M6 are connected to the second terminal of loop filter 524. The first terminal of loop filter 524 has transistors connected to it that are simultaneously connected to the first terminal of antenna coil 502. The second terminal of loop filter 524 has transistors connected to it that are simultaneously connected to the second terminal of antenna coil 502. The loop filter 524 output is connected to loop amplifier 526. This connection is normally differential to reduce impulse noise sensitivity of the phase lock loop. The output of loop amplifier 526 may be single-ended or differential depending on the implementation details of loop amplifier 526 or voltage controlled oscillator 508.

The length of the ring oscillator may be changed from the six stages shown. If the feedback inverter 522 is included, the total number of delay stages must be even, thus for STAGE N 520, the value of N must be an even number to support oscillation. If the number of stages is N odd, then the feedback inverter 522 must be removed and the output of delay stage 520 is connected to the input of delay stage 510 to support oscillation. The feedback inverter time delay is less than the time delay of a delay stage. One PMOS phase detector sampling transistor must be connected in the same manner as that shown for M1, M2, M3, M4, M5 and M6 for every delay stage in the voltage controlled oscillator 508, regardless of the total value of N.

Antenna coil 502 is resonated by the parallel combination of tuning capacitor 504 and the gate capacitances of PMOS transistors M1, M2, M3, M4, M5 and M6. Antenna coil 502 senses an alternating magnetic field at the frequency selected for resonance of the loaded antenna circuit comprising antenna coil 502, tuning capacitor 504, rectifier 506 and transistors M1, M2, M3, M4, M5 and M6. The voltage drive to transistors M1, M2, M3, M4, M5 and M6 is maximized at resonance and causes the transistors to switch at the signal frequency present at the antenna. The antenna frequency is higher than the transition frequency of the transistors. The transistors, therefore, operate in non-quasi-static mode. The transistors are fully enabled or disabled since the coil voltage is guaranteed to be larger than that of the direct current power supply provided by full-wave rectifier 506. Full-wave rectifier 506 provides direct current outputs 528 and 530 as the power supply for voltage-controlled oscillator 508 and loop amplifier 526. The power supply inputs for the delay stages are shown and described in further detail below, and particularly with respect to FIGS. 9-12. A second effect of the rectifier 506 is that the antenna coil voltage swings from a voltage less than the negative output 530 of rectifier 506 to a voltage greater than the positive output 528 of rectifier 506. The negative output 530 is the power supply ground and the positive output 528 is the positive power supply voltage. Voltage-controlled oscillator 508 transistors use this power supply. The gate voltages, therefore, on transistors M1, M2, M3, M4, M5 and M6 in excess of the power supply values will cause the phase detector sampling transistors to switch with maximum difference in transistor channel charge flow between their enabled and disabled states.

The transistors of phase detector of phase lock loop circuit 508 constructed using organic MOS transistors need not have gain at the signal frequency as in a traditional silicon-based circuit. Moreover, the signal drive to the gate of the transistor is in voltage mode from a parallel-tuned inductor-capacitor network. The capacitance of the gate is absorbed into the total capacitance of the tuned network. The result is that the gate voltage can be large depending on the Q, or quality factor of the network. The purpose of the phase lock loop 500 is to cause the frequency of the voltage-controlled oscillator 508 to be a sub-multiple of the input alternating current (AC) signal.

Figure 6:
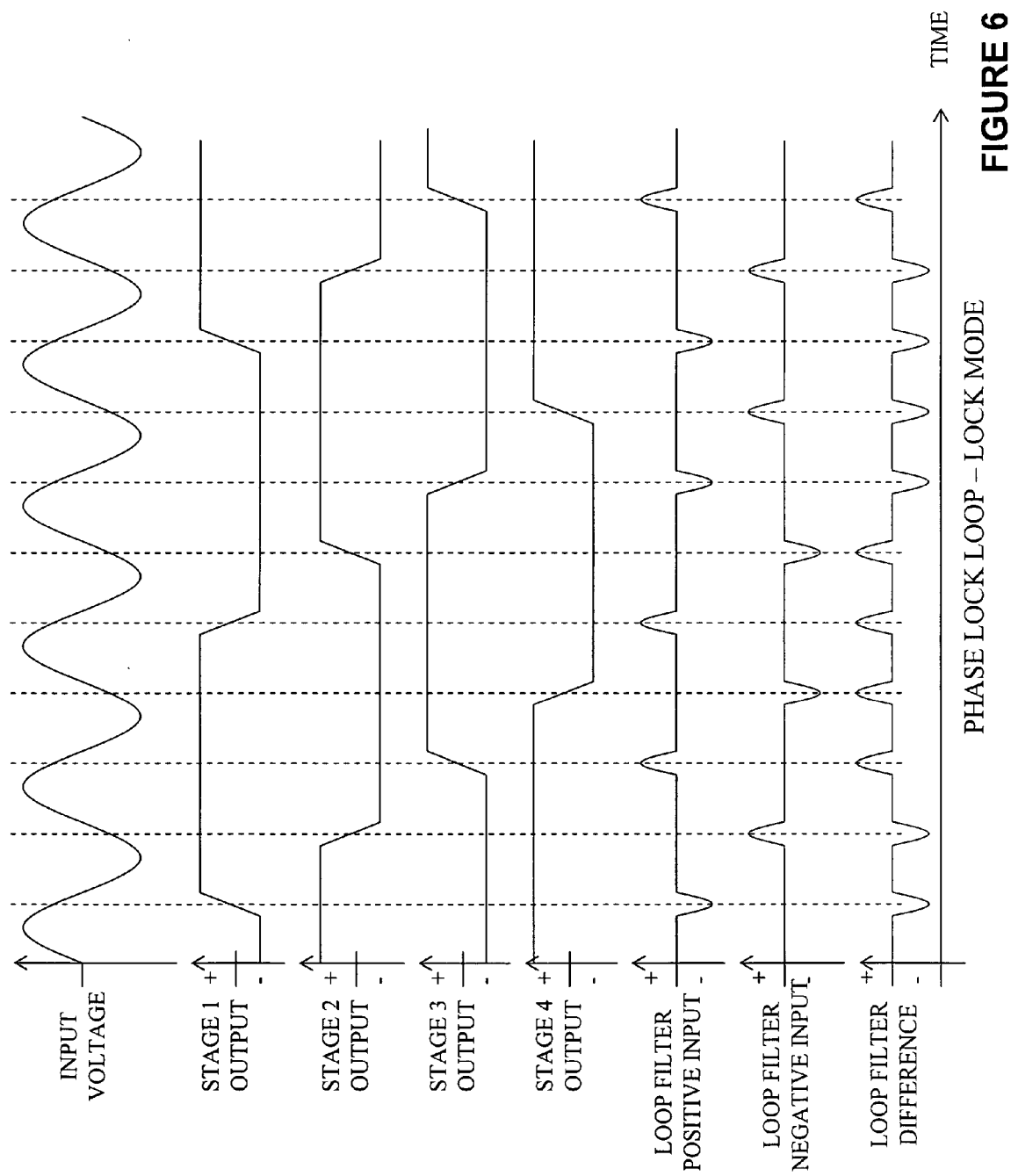
FIG. 6 is a timing diagram for the circuit of FIG. 5, including an antenna input voltage waveform, voltage controlled oscillator stage waveforms, positive and negative loop filter input current waveforms and the loop filter input current difference, operating in the locked mode.

Referring to FIG. 6, a plot of the timing of the phase lock loop in the locked condition is shown. The input voltage is a sinusoid operating at 13.56 MHz. For purposes of explanation, a divide ratio N of four is chosen. This requires that there are four delay stages in the voltage-controlled oscillator. Only the outputs of the four stages 510, 512, 514 and 516 are shown. Stages 518 and 520 are not used and the output of stage 516 is connected to the input of feedback inverter 522 for four-stage operation. The vertical dashed lines show the center of the sampling instants for the switches. Alternate groups of switches perform sampling on every other sampling instant. Therefore, on one sampling instant, the positive input of loop filter 524 is driven and on the next sampling instant, the negative input of loop filter 524 is driven. The sampling periods are fairly short due to the non-quasi-static response of the sampling transistors to the peak of the driving sine wave. Due to the weak current drive of the sampling transistors M1 through M6 their associated output appears as a current signal. Since two or more switches are enabled at a time on the same signal to the input of loop filter 524, the currents are summed. Therefore, a if a negative signal occurs at the output of delay stage 510 and a positive signal occurs at the output of delay stage 512 while both switches M1 and M3 are enabled, the currents in the switches are in opposing directions and cancel resulting in no current into the loop filter on the associated loop filter 524 input. If a positive signal occurs at the output of delay stage 510 and a positive signal occurs at the output of delay stage 512 while both switches M1 and M3 are enabled, the currents in the switches are in aiding directions and the resulting current into the loop filter is positive on the associated loop filter 524 input.

In the locked condition the output frequency of the voltage-controlled oscillator is exactly one divided by N, or for the example shown in FIG. 6, one-fourth of the antenna input frequency. The first sample shown is that from the output of stage 1, 510 and stage 3, 514 being transferred via transistors M1 and M3 to the positive input of loop filter 524. The next sampling instant transfers the outputs from stage 2, 512 and stage 4 516 via M2 and M4 to the negative input of loop filter 524. The differential nature of the loop filter 524 and loop amplifier 526 performs a subtraction of the two input current signals resulting in the loop filter difference plot at the bottom of FIG. 6. The effect on the input of the loop filter is that it receives two current pulses in the negative direction, followed by four current pulses in the positive direction, then two further current pulses in the negative direction. This process repeats indefinitely as long as the antenna and output signal 532 are synchronized at the target frequency ratio. The average of the pulse sequence is zero, indicating that the frequency relationship between the antenna signal and the voltage-controlled oscillator output 532 is correct. The loop filter 524 integrates this signal and maintains the applied voltage to the voltage-controlled oscillator 508 in order to maintain a constant frequency at the output 532.

Figure 7:
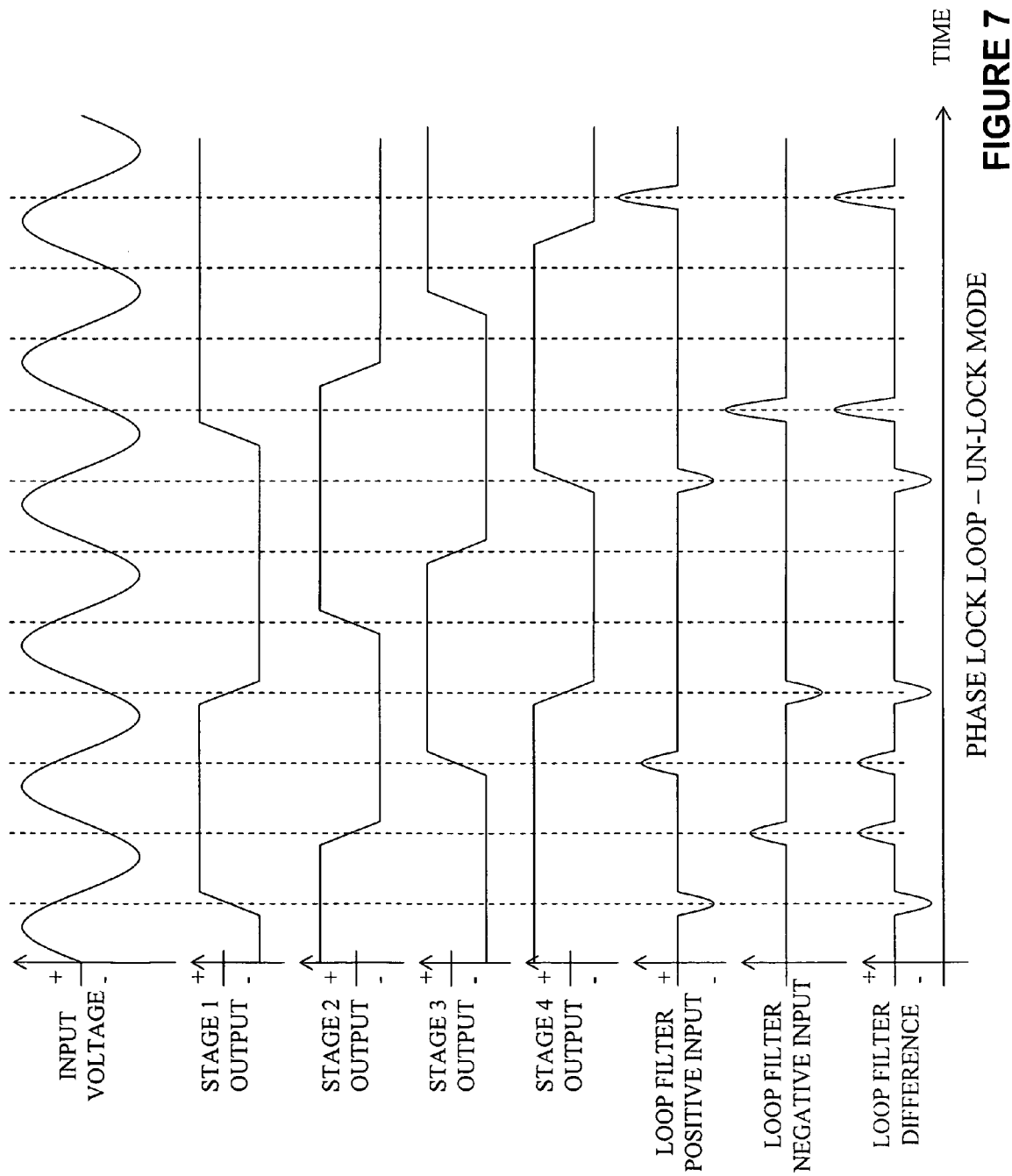
FIG. 7 is a timing diagram for the circuit of FIG. 5, including an antenna input voltage waveform, voltage controlled oscillator stage waveforms, positive and negative loop filter input current waveforms and the loop filter input current difference, operating in the un-locked mode.

Referring to FIG. 7, a plot of the timing of the phase lock loop in the un-locked condition is shown. The input voltage is a sinusoid operating at 13.56 MHz. For purposes of explanation, a divide ratio N of four is chosen as in the example of FIG. 6.

In the un-locked condition the output frequency of the voltage-controlled oscillator 508 is not one divided by N, or for this drawing, one-fourth of the antenna input frequency. The first sample shown is that from the output of stage 1, 510 and stage 3, 514 being transferred via transistors M1 and M3 to the positive input of loop filter 524. The next sampling instant transfers the outputs from stage 2, 512 and stage 4, 516 via M2 and M4 to the negative input of loop filter 524. The differential nature of the loop filter 524 and loop amplifier 526 performs a subtraction of the two input current signals resulting in the loop filter difference plot at the bottom of FIG. 7. Since the frequency relationship between the antenna signal and the voltage-controlled oscillator output 532 is near one-third, the effect on the input of the loop filter is that it receives one current pulses in the negative direction, followed by two current pulses in the positive direction, then one further current pulses in the negative direction. The next two samples are zero. For the first six samples, the average is zero. However, at the seventh sample the output is negative followed by a large positive sample. The ninth and tenth samples are zero, followed by another large positive sample. At this point, the average of the loop filter difference is substantially positive, indicating that the frequency relationship between the antenna signal and the voltage-controlled oscillator output 532 is incorrect. The loop filter integrates the positive average of the samples. The output signal from the filter is amplified in loop amplifier 526 and applied to voltage-controlled oscillator 508 to reduce its output frequency until lock is again achieved. This phase detection scheme senses phase error resulting from increasing or decreasing frequency to result in corrective action.

The fastest voltage-controlled oscillator frequencies possible with the present state of the art for the organic MOS transistor voltage-controlled oscillator are on the order of 1 to 2 MHz. For RFID operation, 423.75 kHz is the required voltage-controlled oscillator frequency and is fairly easily achieved with transistor mobilities exceeding 0.1 V-cm$^2$ at gate lengths near 3 microns. The divide ratio is 13.56 MHz divided by 423.75 kHz resulting in a division ratio N of 32, thereby requiring the use of 32 delay stages. The non-quasistatic delay of the phase detector sampling transistors M1 through M6 is on the order of 20 nanoseconds, below the half-period of 36.9 nanoseconds at 13.56 MHz operation. The result is that the phase detector can operate above the required RFID frequency and control an oscillator capable of supporting required RFID data processing.

Figure 8:
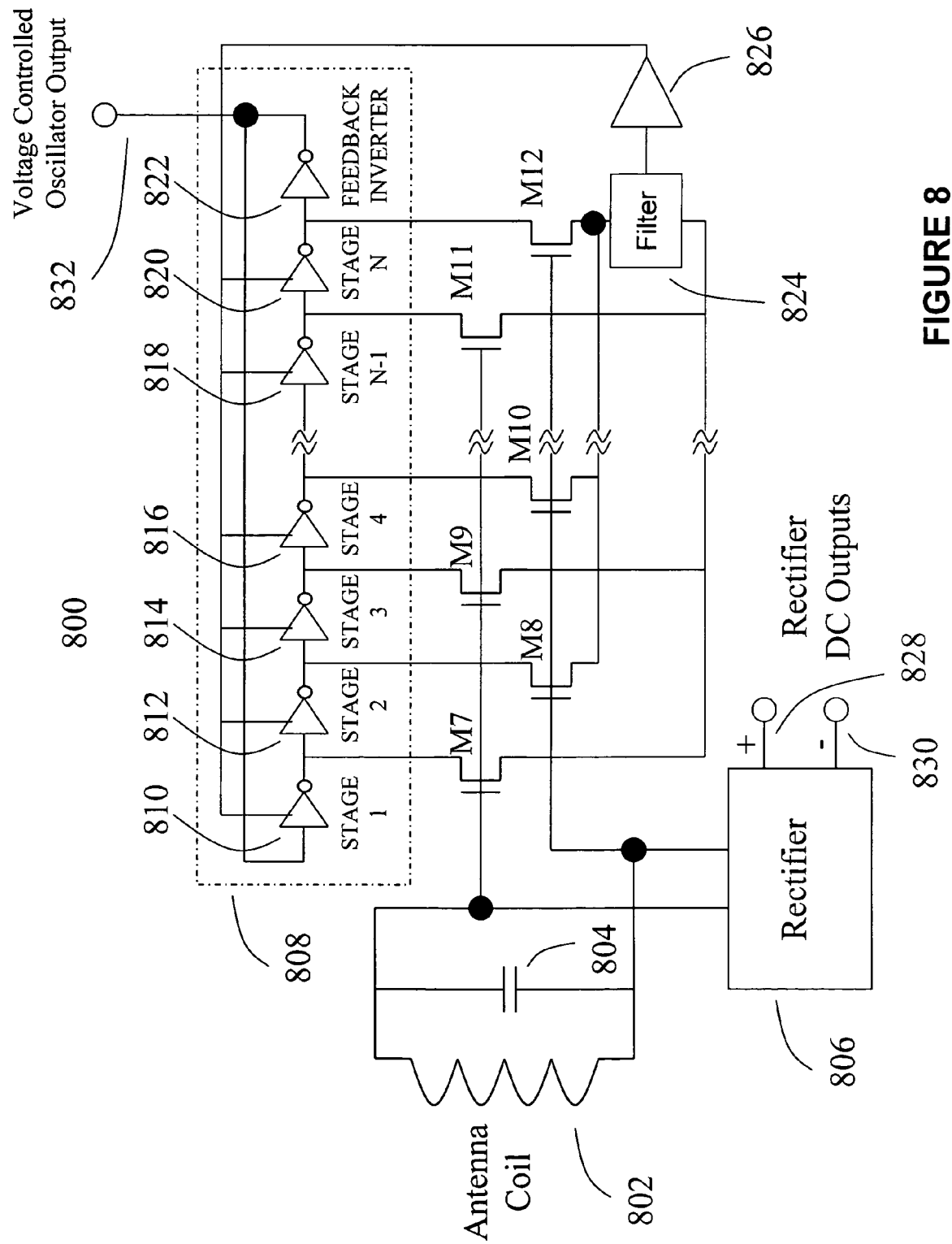
FIG. 8 is a circuit diagram of a phase lock loop frequency divider circuit according to a second embodiment of the invention including an antenna coil, an antenna resonating capacitor, a NMOS organic transistor phase detector circuit, a voltage-controlled oscillator, a loop filter and a loop amplifier.

Alternative circuit configurations can be used other than the one shown in FIG. 5. Referring now to FIG. 8 a phase lock loop frequency divider 800 according to a second embodiment of the present invention is virtually identical to that of the first embodiment 500 of FIG. 5 except that PMOS transistors M1, M2, M3, M4, M5 and M6 have been replaced with NMOS transistors M7, M8, M9, M10, M11 and M12. Operation of phase lock loop 800 is similar to that of phase lock loop 500 except that the NMOS transistors M7, M8, M9, M10, M11 and M12 are enabled with a positive voltage and disabled with a negative voltage applied to their associated gates.

Figure 9:
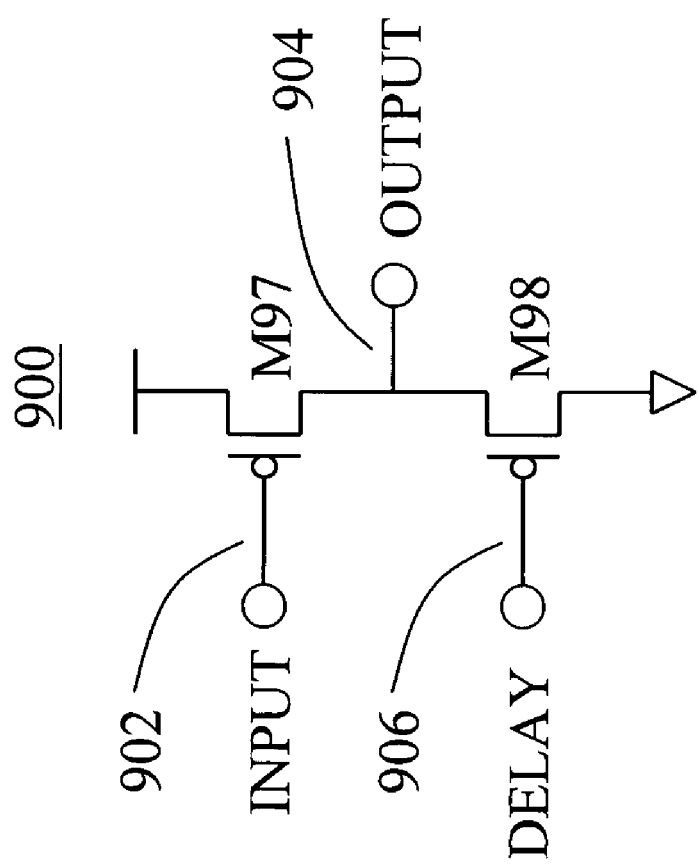
FIG. 9 is a circuit diagram of a first type of delay circuit used in the voltage-controlled oscillator of FIGS. 5 and 8 utilizing PMOS organic transistors.

Referring to FIG. 9, a first embodiment of a delay circuit 900 to be used in the voltage-controlled oscillators 508 or 808 comprises PMOS transistors M97 and M98. Transistor M97 has its source connected to the positive power supply, its gate to the delay stage input 902 and its drain to delay stage output 904. Transistor M98 has its source connected to delay stage output 904, its gate to delay control input 906 and its drain connected to power supply ground. A rising input signal 902 causes a falling output signal 904. The rate of change of the output signal is controlled by the current drawn by M98 that is set by the voltage on delay input 806. Similar action occurs for a falling input signal 902 and rising output signal 904. Variation of the delay control voltage 906 causes a variation of the delay of a pulse signal from input 902 to output 904.

Figure 10:
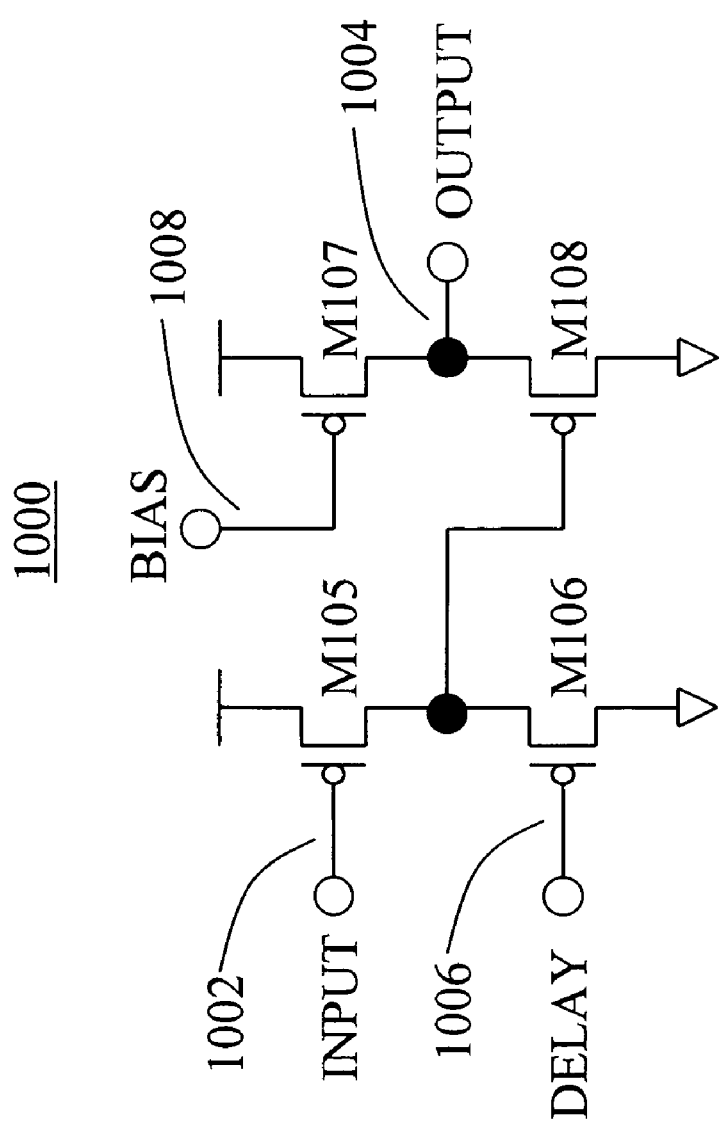
FIG. 10 is a circuit diagram of a second type of delay circuit used in the voltage controlled oscillator of FIGS. 5 and 8 utilizing PMOS organic transistors.

Referring to FIG. 10, a second embodiment of a delay circuit 1000 to be used in the voltage-controlled oscillators 508 or 808 comprises PMOS transistors M105, M106, M107 and M108. Transistor M105 has its source connected to the positive power supply its gate to the delay stage input 1002 and its drain to the gate of transistor M108. Transistor M106 has its source connected to the gate of transistor M108, its gate to delay control input 1006 and its drain connected to power supply ground. Transistor M108 has its source connected to delay stage output 1004, its gate to the drain of M105 and its drain connected to power supply ground. Transistor M107 has its source connected to positive power supply, its gate connected to a bias voltage 1008 and its drain connected to stage delay output 1004. Transistors M105 and M106 operate as in previously described delay cell 900. Transistors M107 and M108 operate as a voltage level shifter. The level shifter improves signal compatibility between oscillator delay stages by moving the output voltage transition level of the stage to a voltage near the input transition level. The bias voltage 1008 is set to optimize this balance. A rising input signal 1002 causes a falling output signal 1004. The rate of change of the output signal is controlled by the current drawn by M106 that is set by the voltage on delay input 1006. Similar action occurs for a falling input signal 1002 and rising output signal 1004. Variation of the delay control voltage 1006 will cause a variation of the delay of a pulse signal from input 1002 to output 1004.

Figure 11:
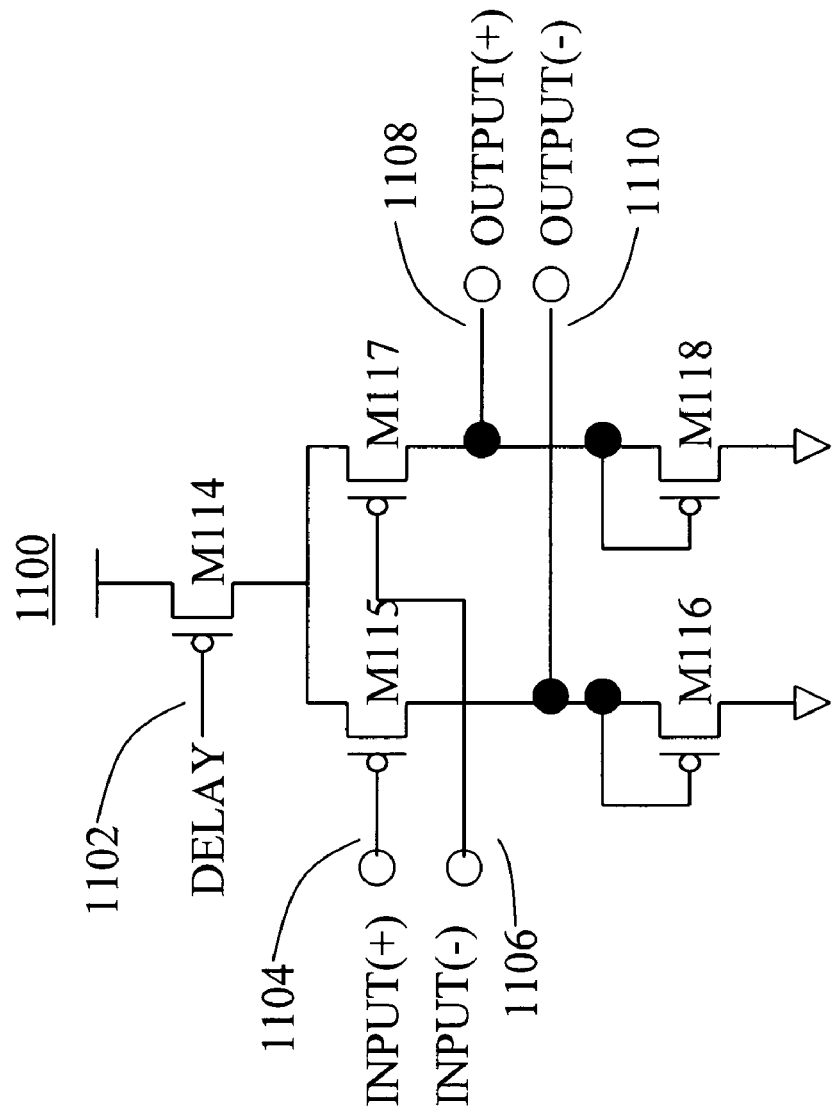
FIG. 11 is a circuit diagram of a third type of delay circuit used in the voltage-controlled oscillator of FIGS. 5 and 8 utilizing PMOS organic transistors.

Referring to FIG. 11, a third embodiment of a delay circuit 1100 to be used in the voltage-controlled oscillators 508 or 808 comprises PMOS transistors M114, M115, M116, M117 and M118. Transistor M114 has its source connected to the positive power supply, its gate to the delay stage input 1102 and its drain to the sources of transistors M115 and M116. M115 and M116 are configured as a differential amplifier with their gates connected to the positive input 1104 and negative input 1106, respectively and their drains connected to the negative output 1110 and positive output 1108, respectively. Load transistors M116 and M118 have their drains connected to the power supply ground. M116 and M118 are constant-current source connected with their gates connected to their associated drains. The drain of M116 is connected to the negative output 1110 and the drain of M118 is connected the positive output 1108. Change in the voltage at the delay control input 1102 causes a change in available current to be switched by M115 and M117 between load devices M116 and M118. A decrease in the available current from M114 results in more time for to charge the input capacitance of the adjacent delay stage connected to the outputs 1108 and 1110 with the effect of increasing the time delay of a signal from inputs 1104 and 1106 to the outputs 1108 and 1110.

Figure 12:
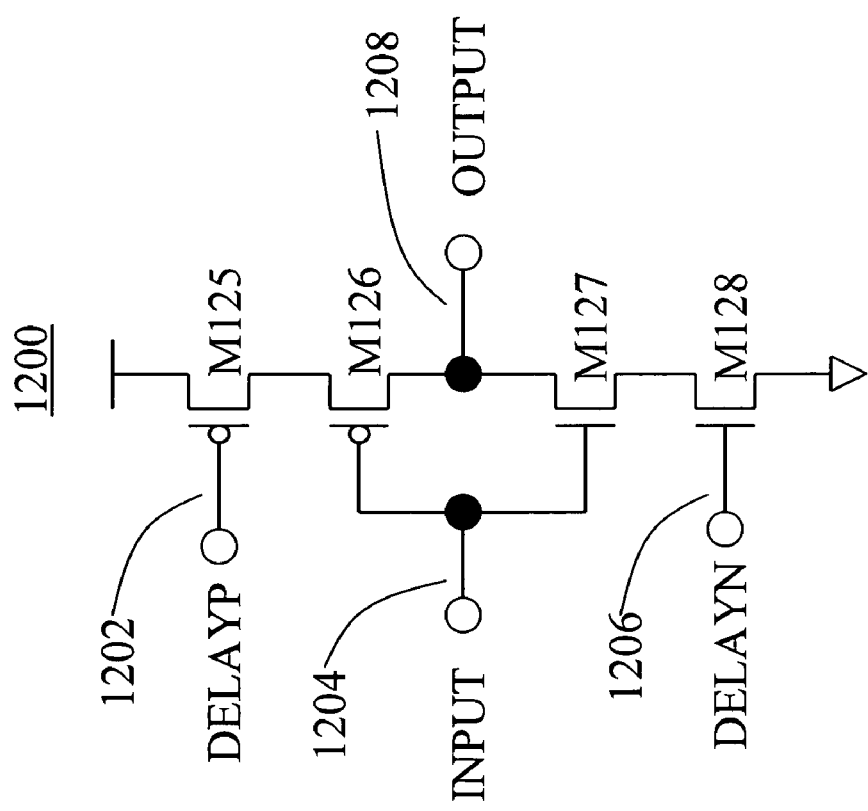
FIG. 12 is a circuit diagram of a fourth type of delay circuit used in the voltage-controlled oscillator of FIGS. 5 and 8 utilizing both PMOS and NMOS organic transistors.

Referring to FIG. 12, a fourth embodiment of a delay circuit 1200 to be used in the voltage-controlled oscillators 508 or 808 comprises PMOS transistors M125 and M126 and NMOS transistors M127 and M128. Transistor M125 is connected as a current source to the positive power supply with current under control of the voltage at DELAYP 1202. Transistor M128 is connected as a current source to the power supply ground with current under control of the voltage at DELAYN 1206. Transistors M126 and M127 comprise a complementary MOS inverter with input 1204 and output 1208. The inverter is current starved by reduction of current from current sources M125 and M128. Charging time of load capacitances present at output 1208 is increased with a resulting increase of time delay of a signal between the input 1204 and the output 1208. This method of delay control requires two control signals 1202 and 1206 from the loop amplifier 524 and these are differential in nature.

Figure 13:
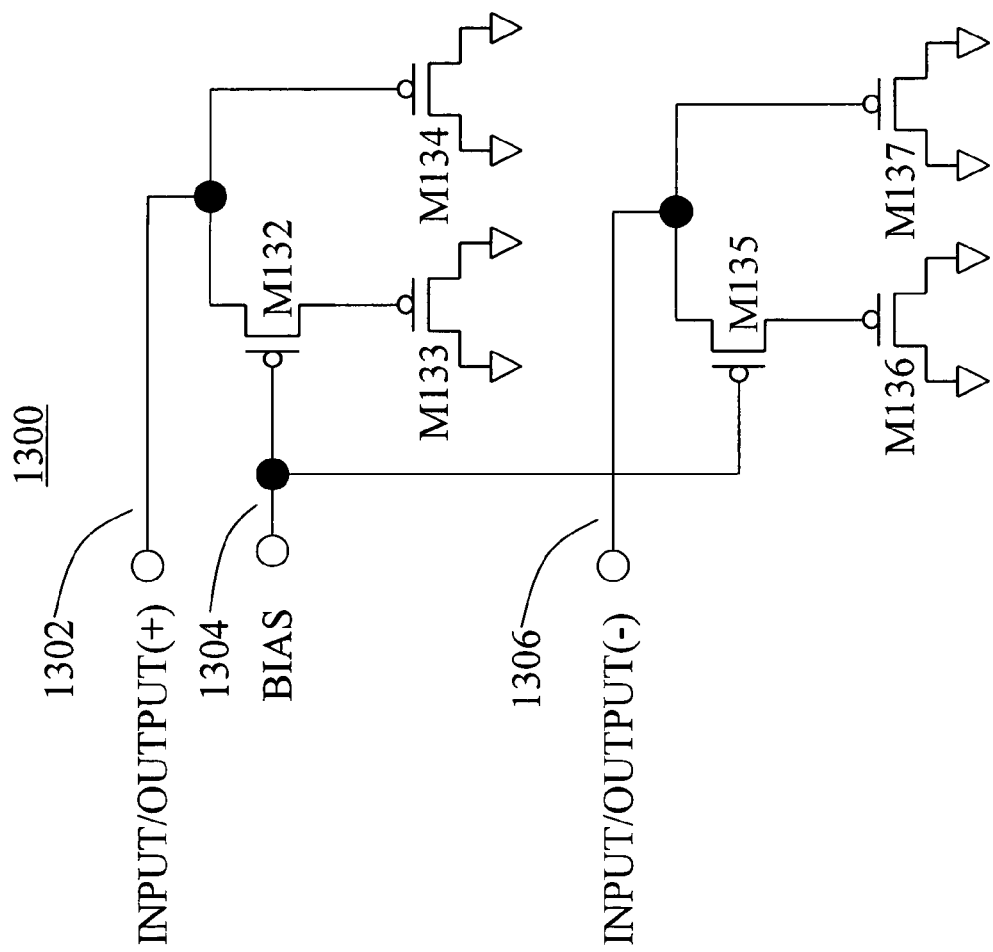
FIG. 13 is a circuit diagram of a first type of loop filter circuit for use in the circuits of FIGS. 5 and 8 utilizing PMOS organic transistors.

Referring to FIG. 13, a first embodiment of a loop filter circuit 1300 to be used in the phase lock loops 500 or 800 comprises PMOS transistors M132 through M137. Transistors M133, M134, M136 and M137 have both source and drain connections to power supply ground. These are operated as capacitors. M132 and M135 are operated as biased resistors by connecting their gates to a bias voltage 1304. M132 then connects the gate of M133 to the positive input/output 1302 via its source-drain channel. Similarly, M135 then connects the gate of M136 to the negative input/output 1306 via its source-drain channel. The gate of M134 is connected to the positive input/output 1302. The gate of M137 is connected to the positive input/output 1302. The circuit implements a proportional-plus-integral (PPI) loop filter for use with the phase lock loop. The two inputs receive signals from the two outputs of the sampling phase detector. The phase detector has a finite series resistance due to the relatively poor conduction of the sampling transistors. The phase detector resistance is in series with the resistance of M132 and M135. If M133 and M136 were infinitely large capacitors, the two resistances implement a voltage divider such that there is a signal loss from the output of the delay stages to the output of the loop filter. This is the proportional component of the PPI filter. The finite capacitances of M133 and M136 interact with M132 and M135 to implement a zero in the transfer function of the filter. This is the integral portion of the response. The PPI filter technique is used to provide a stable second-order closed-loop system for the phase lock loop. Other filters are possible, but the PPI approach has the most flexibility and bandwidth. Transistors M134 and M137 implement a third pole in the overall phase lock loop closed-loop frequency response. This is used to reduce residual alternating current ripple at the output of the loop filter due to switching of the phase detector transistors.

Figure 14:
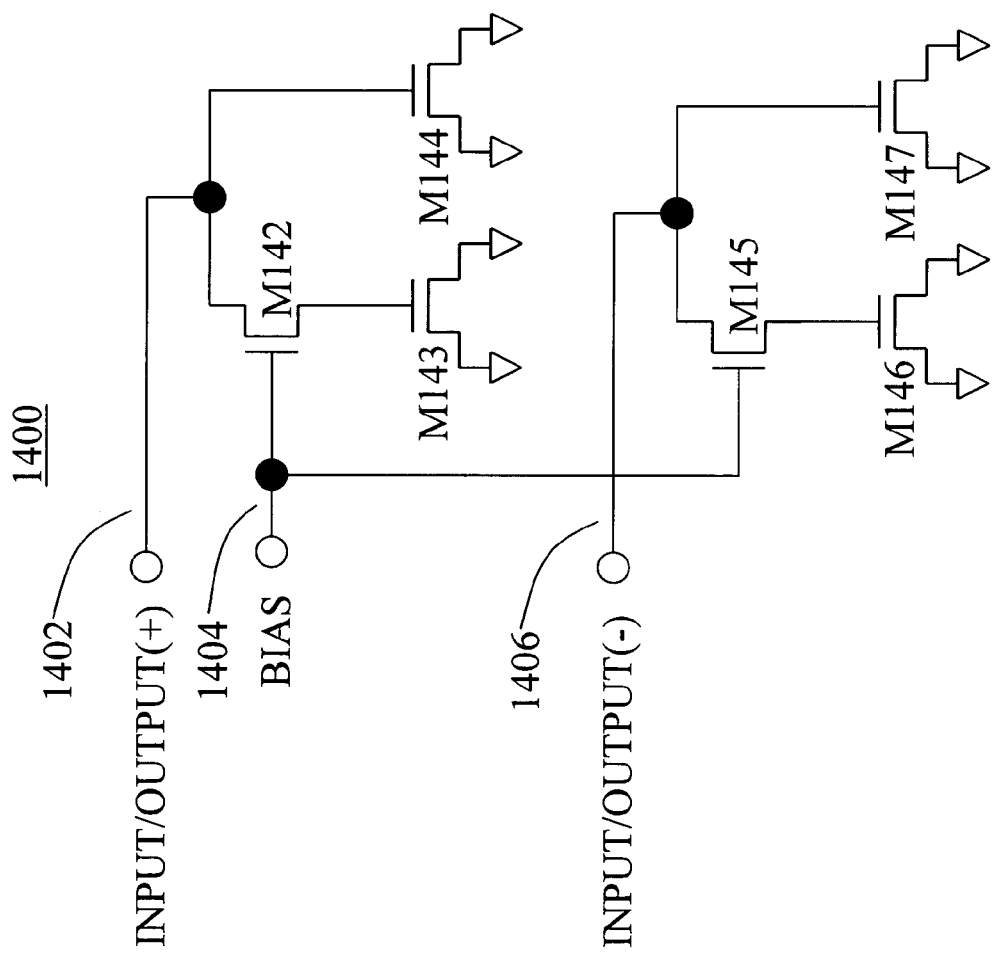
FIG. 14 is a circuit diagram of a second type of loop filter circuit for use in the circuits of FIGS. 5 and 8 utilizing NMOS organic transistors.

Referring to FIG. 14, a second embodiment of a loop filter circuit 1400 to be used in the voltage controlled oscillators 508 or 808 comprises NMOS transistors M142 to M147. This is similar to previously described loop filter circuit 1300, except the PMOS transistors have been replaced with NMOS transistors. Operation is identical to that of loop filter circuit 1300, except that bias voltage 1404 must be adjusted to result in resistive operation of M142 and M145.

Figure 15:
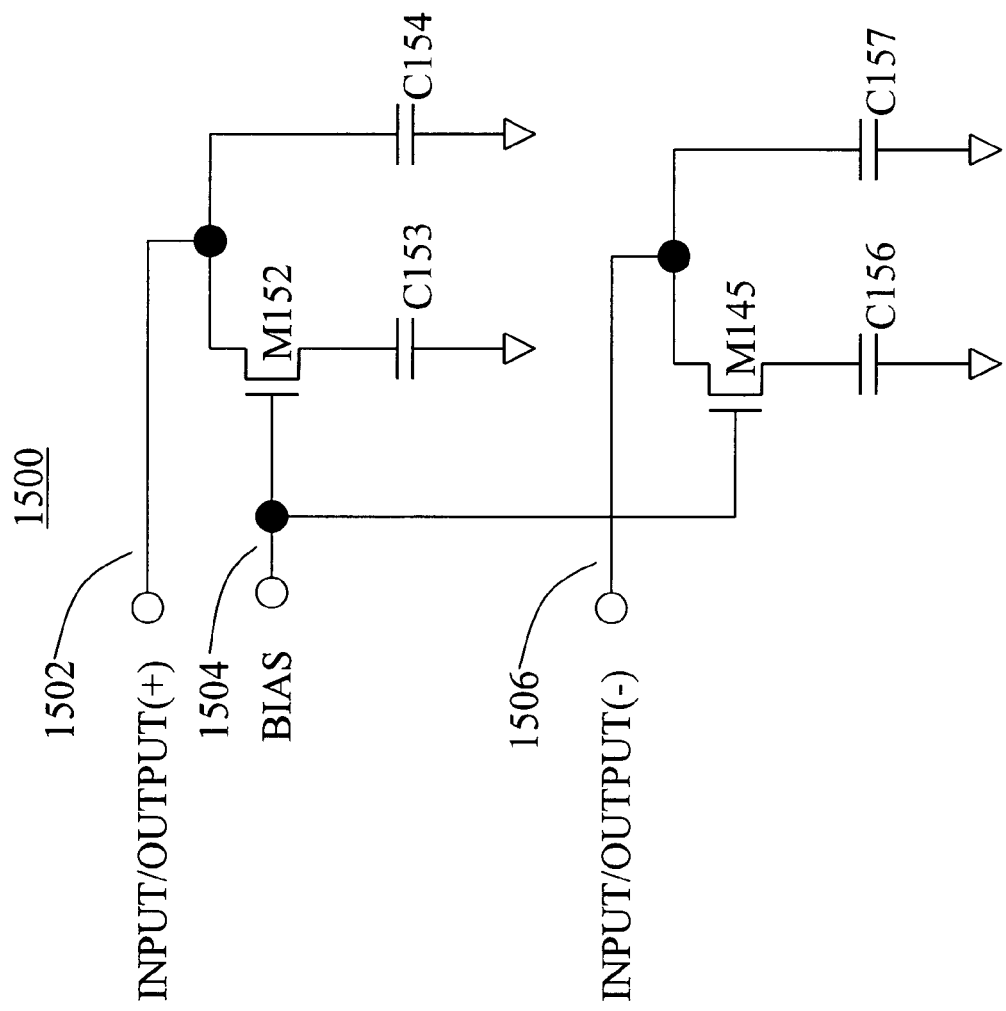
FIG. 15 is a circuit diagram of a third type of loop filter circuit for use in the circuits of FIGS. 5 and 8 utilizing capacitors and organic transistors.

Referring to FIG. 15, a third embodiment of a loop filter circuit 1500 to be used in the voltage controlled oscillators 508 or 808 comprises NMOS transistors M152 and M155 and capacitors C153, C154, C156 and C157. This is similar to previously described loop filter circuit 1400, except the NMOS capacitor connected transistors have been replaced with capacitor elements. Operation is identical to that of loop filter circuit 1400.

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims.

We claim:

1. A phase lock loop circuit comprising a plurality of organic MOS transistors operating in a non-quasistatic mode of operation for providing an output signal frequency that is a sub-multiple of an input signal frequency.

2. The phase lock loop circuit of claim 1 further comprising an antenna coil for providing a differential input signal.

3. The phase lock loop circuit of claim 1 further comprising a capacitor to provide sufficient additional capacitance beyond the gate capacitance of the organic MOS transistors to resonate the parallel tuned network to a predetermined frequency.

4. The phase lock loop circuit of claim 1 further comprising an organic MOS phase detector circuit.

5. A phase lock loop frequency divider comprising:
   an organic transistor phase detector having first and second input terminals for receiving a differential input signal;
   a voltage-controlled oscillator coupled to the phase detector having an output terminal for providing a synchronous output signal that is a frequency sub-multiple of the input signal;
   a filter coupled to the phase detector; and
   an amplifier coupled to the filter for providing voltage control to the voltage-controlled oscillator.

6. The phase lock loop frequency divider of claim 5 further comprising a capacitor coupled between the first and second input terminals.

7. The phase lock loop frequency divider of claim 5 further comprising an antenna coupled between the first and second input terminals.

8. The phase lock loop frequency divider of claim 5 wherein the voltage-controlled oscillator comprises a plurality of delay stages.

9. The phase lock loop frequency divider of claim 8, wherein the delay stage comprises two coupled PMOS organic transistors.

10. The phase lock loop frequency divider of claim 8, wherein the delay stage comprises a first set of two coupled PMOS organic transistors coupled to a second set of two coupled PMOS organic transistors.

11. The phase lock loop frequency divider of claim 8, wherein the delay stage comprises an organic transistor differential amplifier.

12. The phase lock loop frequency divider of claim 8, wherein the delay stage comprises a current-starved organic transistor inverter.

13. The phase lock loop frequency divider of claim 8, wherein the delay stage further comprises a feedback inverter stage.

14. The phase lock loop frequency divider of claim 8, further comprising an even plurality of delay stages.

15. The phase lock loop frequency divider of claim 5, wherein the phase detector comprises PMOS organic transistors.

16. The phase lock loop frequency divider of claim 5, wherein the phase detector comprises NMOS organic transistors.

17. The phase lock loop frequency divider of claim 5, wherein the amplifier comprises a singled-ended output.

18. The phase lock loop frequency divider of claim 5, wherein the amplifier comprises a differential output.

19. The phase lock loop frequency divider of claim 5, wherein the organic transistors in the phase detector are operated in a non-quasistatic mode.

20. The phase lock loop frequency divider of claim 5, further comprising a rectifier coupled to the first and second input terminals and having an output for providing power to the voltage-controlled oscillator.

21. The phase lock loop frequency divider of claim 5, further comprising a rectifier coupled to the first and second input terminals and having an output for providing power to the amplifier.

22. The phase lock loop frequency divider of claim 5, wherein the filter comprises a first PMOS transistor stage including two capacitor-connected PMOS organic transistors, and a second PMOS transistor stage including two capacitor-connected PMOS organic transistors.

23. The phase lock loop frequency divider of claim 5, wherein the filter comprises a first NMOS transistor stage including two capacitor-connected NMOS organic transistors, and a second NMOS transistor stage including two capacitor-connected NMOS organic transistors.

24. The phase lock loop frequency divider of claim 5, wherein the filter comprises a first NMOS transistor stage including two capacitors, and a second NMOS transistor stage including two capacitors.

25. The phase lock loop frequency divider of claim 5, wherein the filter comprises a proportional-plus-integral (PPI) loop filter.

26. A phase lock loop circuit comprising:
   a phase detector for receiving a differential input signal, including a plurality of organic MOS transistors operating in a non-quasistatic mode of operation; and
   a voltage-controlled oscillator for providing a synchronous output signal, and being responsive to the phase detector,
   wherein the output signal frequency is a sub-multiple of the input signal frequency.

27. The phase lock loop circuit of claim 26 further comprising an antenna coil for providing the differential input signal.

28. The phase lock loop circuit of claim 26 further comprising a capacitor to provide sufficient additional capacitance beyond the gate capacitance of the organic MOS transistors in the phase detector to resonate the parallel tuned network to a predetermined frequency.

29. The phase lock loop circuit of claim 26 wherein the plurality of organic MOS transistors comprises a plurality of organic PMOS transistors.

30. The phase lock loop circuit of claim 26 wherein the plurality of organic MOS transistors comprises a plurality of organic NMOS transistors.

31. A phase lock loop frequency divider comprising:

an organic transistor phase detector having first and second input terminals for receiving a differential input signal;

a voltage-controlled oscillator coupled to the phase detector having an output terminal for providing a synchronous output signal;

a filter coupled to the phase detector; and an amplifier coupled to the filter for providing voltage control to the voltage-controlled oscillator, wherein the filter comprises a first PMOS transistor stage including two capacitor-connected PMOS organic transistors, and a second PMOS transistor stage including two capacitor-connected PMOS organic transistors.

32. A phase lock loop frequency divider comprising:

an organic transistor phase detector having first and second input terminals for receiving a differential input signal;

a voltage-controlled oscillator coupled to the phase detector having an output terminal for providing a synchronous output signal;

a filter coupled to the phase detector; and an amplifier coupled to the filter for providing voltage control to the voltage-controlled oscillator, wherein the filter comprises a first NMOS transistor stage including two capacitor-connected NMOS organic transistors, and a second NMOS transistor stage including two capacitor-connected NMOS organic transistors.

33. A phase lock loop frequency divider comprising:

an organic transistor phase detector having first and second input terminals for receiving a differential input signal;

a voltage-controlled oscillator coupled to the phase detector having an output terminal for providing a synchronous output signal;

a filter coupled to the phase detector; and an amplifier coupled to the filter for providing voltage control to the voltage-controlled oscillator, wherein the filter comprises a first NMOS transistor stage including two capacitors, and a second NMOS transistor stage including two capacitors.

* * * * *